(12) United States Patent
Shirahata et al.

(10) Patent No.: US 10,351,957 B2
(45) Date of Patent: Jul. 16, 2019

(54) METHOD FOR PRODUCING METAL OXIDE FILM AND METAL OXIDE FILM

(75) Inventors: Takahiro Shirahata, Tokyo (JP); Hiroyuki Orita, Tokyo (JP); Takahiro Hiramatsu, Tokyo (JP)

(73) Assignee: TOSHIBA MITSUBISHI-ELECTRIC INDUSTRIAL SYSTEMS CORPORATION, Tokyo (JP)

( * ) Notice: Subject to any disclaimer, the term of this patent is extended or adjusted under 35 U.S.C. 154(b) by 899 days.

(21) Appl. No.: 14/384,603

(22) PCT Filed: Mar. 28, 2012

(86) PCT No.: PCT/JP2012/058153
§ 371 (c)(1),
(2), (4) Date: Sep. 11, 2014

(87) PCT Pub. No.: WO2013/145160
PCT Pub. Date: Oct. 3, 2013

(65) Prior Publication Data
US 2015/0034885 A1    Feb. 5, 2015

(51) Int. Cl.
*H01B 1/08*    (2006.01)
*C23C 18/12*    (2006.01)
(Continued)

(52) U.S. Cl.
CPC ...... *C23C 18/1216* (2013.01); *C23C 18/1258* (2013.01); *C23C 18/1291* (2013.01);
(Continued)

(58) Field of Classification Search
CPC ...................................................... H01B 1/08
See application file for complete search history.

(56) References Cited

U.S. PATENT DOCUMENTS

2003/0003303 A1    1/2003  Ohtsu et al.
2009/0298226 A1   12/2009  Umeda et al.
(Continued)

FOREIGN PATENT DOCUMENTS

CN           102165096 A       8/2011
DE    11 2008 004 012 T5       9/2011
(Continued)

OTHER PUBLICATIONS

International Preliminary Report on Patentability and Written Opinion dated Oct. 9, 2014 in PCT/JP2012/058153 filed on Mar. 28, 2012 (with English Translation).
(Continued)

*Primary Examiner* — William D Young
(74) *Attorney, Agent, or Firm* — Oblon, McClelland, Maier & Neustadt, L.L.P.

(57) ABSTRACT

In a method for producing a metal oxide film according to the present invention, a solution containing zinc is sprayed onto a substrate placed under non-vacuum, and then, a dopant solution containing a dopant is sprayed onto the substrate. After that, a deposited metal oxide film is subjected to a resistance reducing treatment. A molar concentration of the dopant supplied to the substrate with respect to a molar concentration of the zinc supplied to the substrate is not less than a predetermined value.

7 Claims, 5 Drawing Sheets

(51) Int. Cl.
*H01L 31/18* (2006.01)
*C23C 18/14* (2006.01)

(52) U.S. Cl.
CPC .......... *C23C 18/1295* (2013.01); *C23C 18/14* (2013.01); *H01B 1/08* (2013.01); *H01L 31/1884* (2013.01); *Y02E 10/50* (2013.01)

(56) References Cited

U.S. PATENT DOCUMENTS

| | | | |
|---|---|---|---|
| 2011/0151619 A1* | 6/2011 | Orita | .................... C23C 16/407 438/104 |
| 2012/0015147 A1 | 1/2012 | Maa et al. | |
| 2012/0031484 A1 | 2/2012 | Matsuno et al. | |
| 2012/0040083 A1 | 2/2012 | Orita et al. | |

FOREIGN PATENT DOCUMENTS

| | | |
|---|---|---|
| JP | 1 264929 | 10/1989 |
| JP | 9 45140 | 2/1997 |
| JP | 2005 29408 | 2/2005 |
| JP | 2011 124330 | 6/2011 |
| KR | 10-2011-0056522 A | 5/2011 |
| TW | 201213265 | 4/2012 |
| WO | 2010 035313 | 4/2010 |
| WO | 2010 123030 | 10/2010 |
| WO | 2011 155635 | 12/2011 |

OTHER PUBLICATIONS

Office Action dated Nov. 10, 2015 in Chinese Patent Application No. 201280071728.2 (with English language translation).
Office Action dated Dec. 1, 2015 in Japanese Patent Application No. 2014-507128 (with English language translation).
Search Report dated May 6, 2015 in Chinese Patent Application No. 2012800717282 (with partial English translation).
Office Action dated Aug. 28, 2015 in Korean Patent Application No. 10-2014-7026730 (with Japanese language translation and English language translation based on Japanese language translation).
Office Action dated Jan. 11, 2016 in Korean Patent Application No. 10-2014-7026730 with partial English translation and Japanese translation.
J.G. Lu, et a., "Zno-based thin films synthesized by atmospheric pressure mist chemical vapor deposition", Journal of Crystal Growth, vol. 299, pp. 1-10, (2007).
International Search Report dated May 15, 2012 in PCT/JP12/058153 Filed Mar. 28, 2012.
Taiwanese Search Report dated May 14, 2014 in Taiwanese Application 101119711 May 22, 2014.

* cited by examiner

F I G . 3
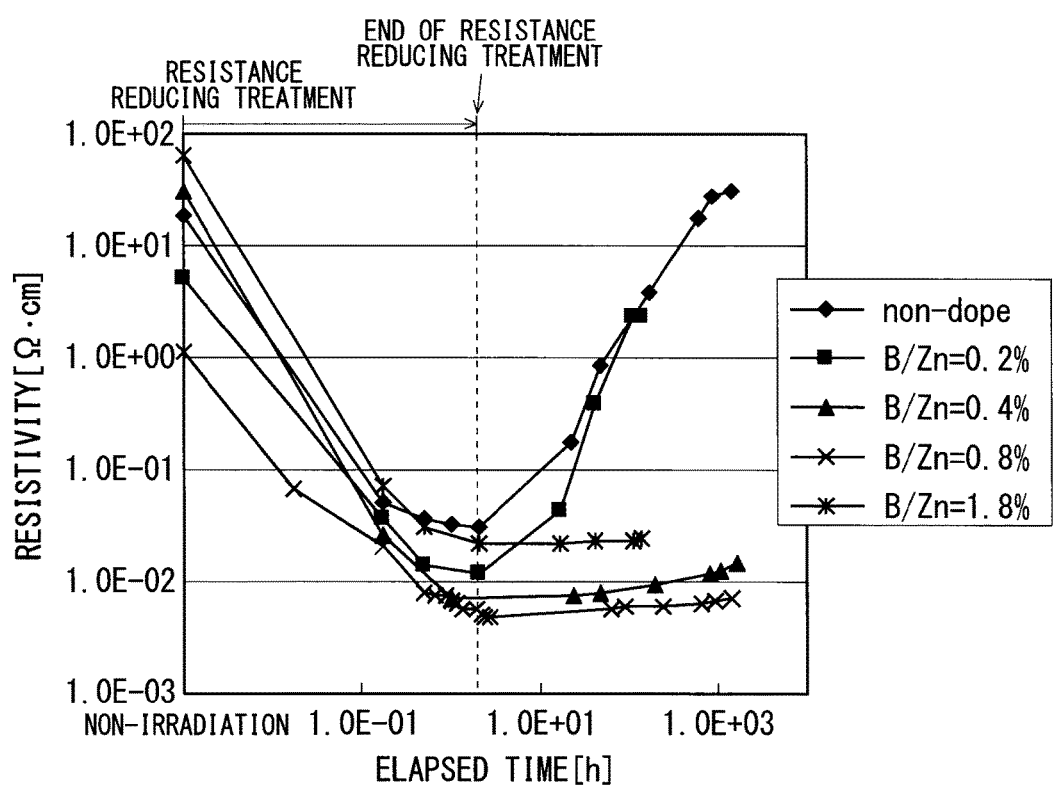

|  | Zn SUPPLY AMOUNT [mmol/min] | H₂O SUPPLY AMOUNT [mmol/min] |
|---|---|---|
| none-dope | 1.26 | 67 |
| B/Zn=0.2% | 1.05 | 67 |
| B/Zn=0.4% | 1.05 | 67 |
| B/Zn=0.8% | 1.05 | 67 |
| B/Zn=1.8% | 1.05 | 67 |

|  | Zn SUPPLY AMOUNT [mmol/min] | H2O SUPPLY AMOUNT [mmol/min] |
|---|---|---|
| none-dope | 1.26 | 67 |
| In/Zn=0.4% | 0.53 | 67 |
| In/Zn=0.8% | 0.53 | 67 |
| In/Zn=2% | 0.53 | 67 |

F I G . 8

|  | Zn SUPPLY AMOUNT [mmol/min] | H2O SUPPLY AMOUNT [mmol/min] |
|---|---|---|
| none-dope | 1.26 | 67 |
| Ga/Zn=0.33% | 1.26 | 67 |
| Ga/Zn=0.5% | 1.26 | 67 |
| Ga/Zn=0.67% | 1.26 | 67 |
| Ga/Zn=0.83% | 1.26 | 67 |
| Ga/Zn=1.17% | 1.26 | 67 |
| Ga/Zn=2.67% | 0.63 | 67 |

METHOD FOR PRODUCING METAL OXIDE FILM AND METAL OXIDE FILM

TECHNICAL FIELD

The present invention relates to a method for producing a metal oxide film and a metal oxide film and is applicable to a method for producing a metal oxide film for use in, for example, solar cells and electronic devices.

BACKGROUND ART

Techniques such as metal organic chemical vapor deposition (MOCVD) and sputtering that use a vacuum are employed as the method for depositing a metal oxide film for use in, for example, solar cells and electronic devices. The metal oxide films produced by those methods for producing a metal oxide film have excellent film properties.

For example, a transparent conductive film produced by the above-mentioned method for producing a metal oxide film has a low resistance and, if the produced transparent conductive film is heated, its resistance does not increase.

Patent Literature 1 is an example of the prior literatures regarding the deposition of a zinc oxide film by the MOCVD technique. Patent Literature 2 is an example of the prior literatures regarding the deposition of a zinc oxide film by the sputtering technique.

CITATION LIST

Patent Literatures

Patent Literature 1: Japanese Patent Application Laid-Open No. 2011-124330
Patent Literature 2: Japanese Patent Application Laid-Open No. 09-45140 (1997)

SUMMARY OF INVENTION

Problems to be Solved by the Invention

Unfortunately, the MOCVD technique requires a high cost in addition to requiring the use of materials that are unstable in the air, which makes it less convenient. Also, a plurality of apparatuses are required in producing a metal oxide film having a laminated structure by sputtering, which unfortunately increases an apparatus cost. Therefore, a method for producing a metal oxide film, which is capable of producing a low-resistance metal oxide film at low cost, is desired.

The present invention therefore has an object to provide a method for producing a metal oxide film, which is capable of producing a low-resistance metal oxide film at low cost. The present invention has another object to provide a metal oxide film deposited by the method for producing a metal oxide film.

Means for Solving the Problems

To achieve the above-mentioned objects, a method for producing metal oxide film according to the present invention includes the steps of: (A) spraying a solution containing zinc onto a substrate placed under non-vacuum; (B) spraying a dopant solution containing a dopant onto the substrate in the step (A); and (C) performing, on a metal oxide film deposited on the substrate through the step (A) and the step (B), a resistance reducing treatment that does not involve rearrangement of crystals of the metal oxide film. In the steps (A) and (B), a molar concentration of the dopant supplied to the substrate with respect to a molar concentration of the zinc supplied to the substrate is not less than a predetermined value.

Effects of the Invention

The method for producing metal oxide film according to the present invention includes the steps of: (A) spraying a solution containing zinc onto a substrate placed under non-vacuum; (B) spraying a dopant solution containing a dopant onto the substrate in the step (A); and (C) performing, on a metal oxide film deposited on the substrate through the step (A) and the step (B), a resistance reducing treatment that does not involve rearrangement of crystals of the metal oxide film. In the steps (A) and (B), a molar concentration of the dopant supplied to the substrate with respect to a molar concentration of the zinc supplied to the substrate is not less than a predetermined value.

The method for producing a metal oxide film according to the present invention performs the deposition process for a metal oxide film on a substrate under non-vacuum. This reduces the cost of the deposition process (deposition apparatus cost), which also improves convenience.

The method for producing a metal oxide film according to the present invention performs the resistance reducing treatment on a deposited metal oxide film. Therefore, even in a case where a metal oxide film is deposited on a substrate under non-vacuum, the resistance of the metal oxide film can be reduced (the resistance of a metal oxide film deposited under non-vacuum can be reduced to be substantially equal to the resistance of a metal oxide film deposited under vacuum).

The method for producing a metal oxide film according to the present invention further supplies (sprays) zinc and a dopant onto a substrate, to thereby deposit a metal oxide film on the substrate. When zinc and a dopant are supplied onto the substrate, a (dopant)/Zn molar concentration ratio is set to be not less than a predetermined value. This allows for suppressing an increase in the resistance of a metal oxide film subjected to the resistance reducing treatment after a lapse of a long period of time from the resistance reducing treatment.

The object, features, aspects and advantages of the present invention will become more apparent from the following detailed description and the attached drawings.

BRIEF DESCRIPTION OF THE DRAWINGS

FIG. 3 A diagram showing variations over time of the resistivities of metal oxide films deposited by the method for producing a metal oxide film according to the present invention.

FIG. 8 A diagram showing deposition conditions of the metal oxide films.

DESCRIPTION OF EMBODIMENT

A method for producing a metal oxide film according to the present invention performs a deposition process under non-vacuum (at atmospheric pressure). Herein, a metal oxide film containing zinc (Zn) deposited under non-vacuum (at atmospheric pressure) has high resistance after deposition. For this reason, the metal oxide film immediately after deposition is subjected to a resistance reducing treatment that does not involve a high-temperature treatment (that is, the metal oxide film immediately after deposition is subjected to the resistance reducing treatment to provide energy of a bandgap or more of a metal oxide film, the process not involving crystal reconfiguration of a metal oxide film). For example, ultraviolet irradiation for a metal oxide film is adoptable as the resistance reducing treatment.

The resistance reducing treatment can reduce the resistance of a metal oxide film immediately after the resistance reducing treatment.

The inventors have found that the resistance of a metal oxide film containing no dopant (undoped metal oxide film) increases again after a lapse of time from the resistance reducing treatment.

Also, the inventors have found that when a dopant and zinc are supplied to a substrate, a molar concentration of the dopant to be supplied to the substrate with respect to the molar concentration of the zinc to be supplied to the substrate is set to be not less than a predetermined value (in other words, with a lower limit set to a molar concentration ratio of a dopant with respect to zinc to be supplied to the substrate, a dopant of this molar concentration of the lower limit or more is supplied to the substrate), suppressing an increase in the resistance of the metal oxide film even after a lapse of time from the resistance reducing treatment.

The present invention will be specifically described below with reference to the drawings showing an embodiment thereof.

<Embodiment>

Figure 1:
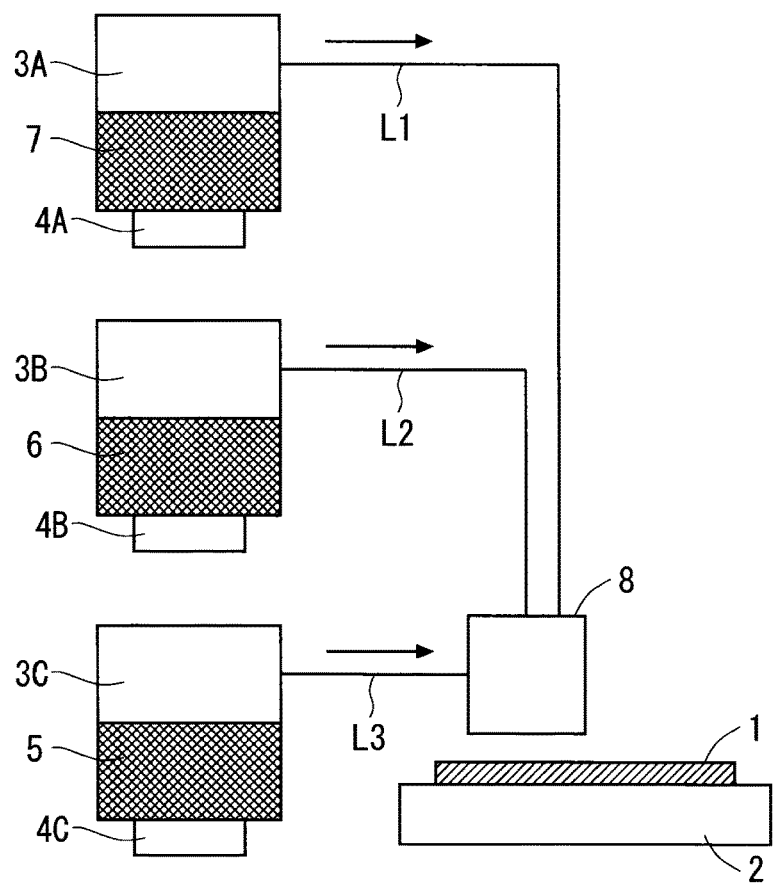
FIG. 1 A configuration diagram of a deposition apparatus for describing a method for depositing a metal oxide film according to the present invention.

The method for producing a metal oxide film according to this embodiment will be specifically described with the use of a production apparatus (deposition apparatus) shown in FIG. 1.

First, a solution 7 containing at least zinc is produced. Herein, an organic solvent such as ether or alcohol is used as a solvent of the solution 7. The produced solution 7 is filled into a container 3A as shown in FIG. 1.

Water ($H_2O$) is used as an oxidation source 6 and, as shown in FIG. 1, the oxidation source 6 is filled into a container 3B. While oxygen, ozone, hydrogen peroxide, $N_2O$, $NO_2$, and the like can be used as the oxidation source 6 in addition to water, water is desirably used in terms of inexpensive cost and easy handling (the oxidation source 6 is water in the following description).

Also, a dopant solution 5 containing a dopant is produced. For example, the dopant solution 5 containing boron (B) is produced. Usable as the dopant solution 5 is, for example, a boric acid ($H_3BO_3$) solution. The produced dopant solution 5 is filled into a container 3C as shown in FIG. 1.

Next, the solution 5, the oxidation source 6, and the solution 7 are individually formed into mist. The container 3A is provided with an atomizer 4A on the bottom thereof, the container 3B is provided with an atomizer 4B on the bottom thereof, and the container 3C is provided with an atomizer 4C on the bottom thereof. The atomizer 4A forms the solution 7 in the container 3A into mist, the atomizer 4B forms the oxidation source 6 in the container 3B into mist, and the atomizer 4C forms the dopant solution 5 in the container 3C into mist.

The misted solution 7 passes through a path L1 to be supplied to a nozzle 8, the misted oxidation source 6 passes through a path L2 to be supplied to the nozzle 8, and the misted dopant solution 5 passes through a path L3 to be supplied to the nozzle 8. As shown in FIG. 1, herein, the path L1, the path L2, and the path L3 are different paths.

It is necessary in the present invention that a molar concentration of a dopant to be supplied to a substrate 1 with respect to a molar concentration of zinc to be supplied to the substrate 1 (that is, a dopant/Zn molar concentration ratio) be larger than or equal to a predetermined value. The molar concentration ratio is adjustable by adjusting a carrier gas amount (liter/min) of the solution 7 to be supplied to the nozzle 8 (or the substrate 1), a molar concentration of zinc in the solution 7, a carrier gas amount (liter/min) of the dopant solution 5 to be supplied to the nozzle 8 (or the substrate 1), and a molar concentration of a dopant in the dopant solution 5.

As shown in FIG. 1, the substrate 1 is placed on a heating unit 2. Herein, the substrate 1 is placed under non-vacuum (at atmospheric pressure). The misted solution 7, the misted oxidation source 6, and the misted dopant solution 5 are sprayed onto the substrate 1 placed under non-vacuum (at atmospheric pressure) from discrete exhaust ports by means of the nozzle 8. In this spraying, the substrate 1 is heated to, for example, about 200° C. on the heating unit 2.

The above-mentioned process deposits a metal oxide film (zinc oxide film being a transparent conductive film) having a predetermined film thickness on the substrate 1 placed under non-vacuum (at atmospheric pressure). As apparent from the above-mentioned process, in the present invention, the deposited metal oxide film contains zinc, and further, zinc contains a dopant.

The metal oxide film deposited under non-vacuum (at atmospheric pressure) has a resistance higher than that of the metal oxide film deposited under vacuum, such as through sputtering. Thus, the method for producing a metal oxide film according to the present invention performs the resistance reducing treatment to provide energy of not less than a bandgap of a metal oxide film, the process not involving rearrangement of crystals of a metal oxide film.

Figure 2:
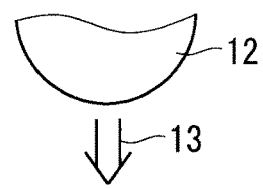
FIG. 2 A diagram for describing a method for producing a metal oxide film (in particular, a resistance reducing treatment) according to the present invention.
Figure 2:
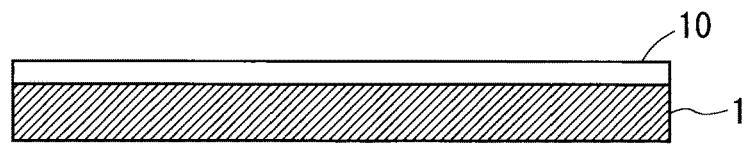

For example, as shown in FIG. 2, the method for producing a metal oxide film according to this embodiment irradiates the entire main surface of the metal oxide film 10 deposited on the substrate 1 with ultraviolet rays 13 using an ultraviolet lamp 12 or the like. The irradiation of the ultraviolet rays 13 can reduce a resistance (resistivity) of the metal oxide film 10.

If a metal oxide film is, for example, an undoped film as described above, a resistance thereof increases after a lapse of time even by performing the resistance reducing treatment on the deposited metal oxide film. This results in that the resistance of the metal oxide film returns to a resistance value prior to the resistance reducing treatment.

Meanwhile, if the metal oxide film contains a dopant and a dopant/Zn molar concentration ratio in supply of a dopant and zinc to the substrate 1 is not less than a predetermined value, the metal oxide film is subjected to the resistance reducing treatment, suppressing an increase in the resistance of the metal oxide film after a lapse of time from the resistance reducing treatment.

FIG. 3 shows experimental data on an effect of suppressing a resistance increase as described above. FIG. 3 shows variations over time of the resistivity of each metal oxide film. To be more specific, FIG. 3 shows variations over time of the resistivity of each metal oxide film during irradiation of ultraviolet rays (resistance reducing treatment) and after the irradiation of ultraviolet rays. The vertical axis and horizontal axis of FIG. 3 indicate resistivity ($\Omega\cdot cm$) and time (h), respectively.

For the experimental data shown in FIG. 3, the measurement targets are an undoped metal oxide film containing zinc and a plurality of metal oxide films containing a dopant and zinc. Herein, the dopant is boron. FIG. 3 shows, as a plurality of metal oxide films containing a dopant and zinc, a metal oxide film having a B/Zn molar concentration ratio of 0.2% when zinc and boron were supplied to the substrate 1, a metal oxide film having a B/Zn molar concentration ratio of 0.4% when zinc and boron were supplied to the substrate 1, a metal oxide film having a B/Zn molar concentration ratio of 0.8% when zinc and boron were supplied to the substrate 1, and a metal oxide film having a B/Zn molar concentration ratio of 1.8% when zinc and boron were supplied to the substrate 1.

Herein, the temperature for depositing all the metal oxide films is 200° C. Each metal oxide film is deposited in the deposition apparatus shown in FIG. 1, and the deposition conditions are as shown in FIG. 4.

Figures 4, 5:
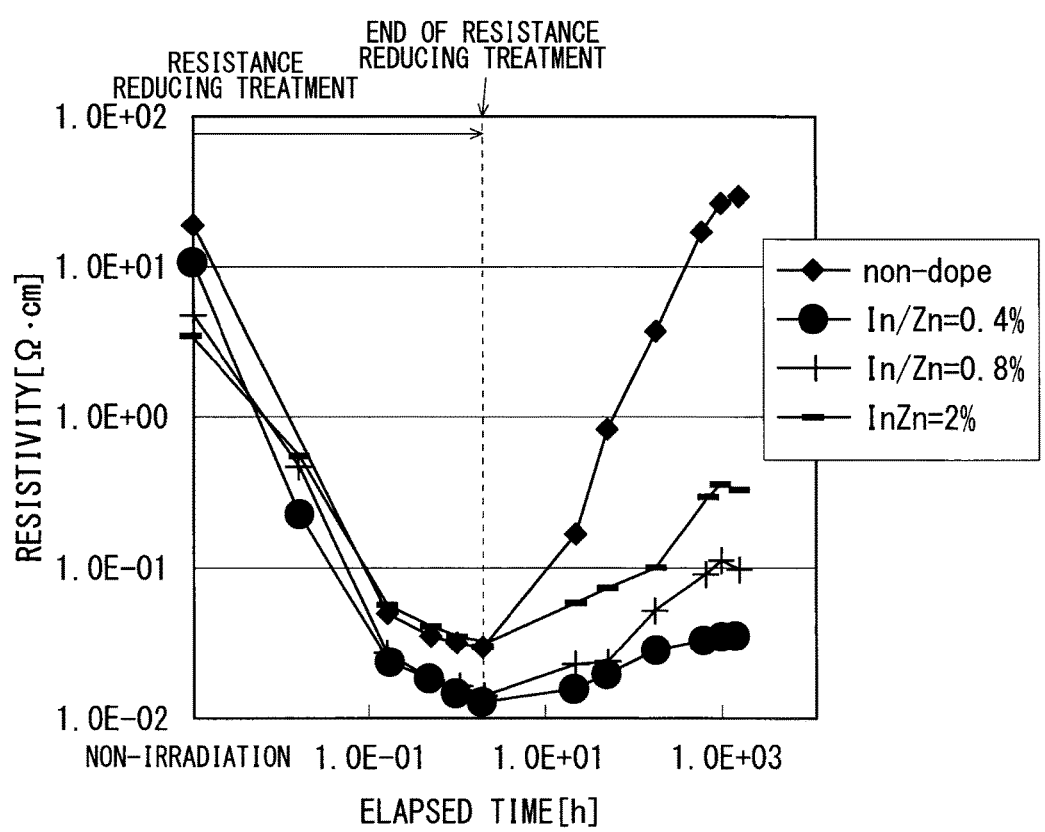
FIG. 4 A diagram showing deposition conditions of the metal oxide films.
FIG. 5 A diagram showing variations over time of the resistivities of metal oxide films deposited by the method for producing a metal oxide film according to the present invention.

As shown in FIG. 4, for an undoped metal oxide film, an amount of zinc supplied to the substrate 1 is 1.26 m (milli) mol/min, and an amount of an oxidizing agent (water) supplied to the substrate 1 is 67 mmol/min.

As shown in FIG. 4, for the metal oxide films respectively having B/Zn molar concentration ratios of 0.2%, 0.4%, 0.8%, and 1.8%, an amount of zinc supplied to the substrate 1 is 1.05 mmol/min, and an amount of an oxidizing agent (water) supplied to the substrate 1 is 67 mmol/min.

As shown in FIG. 3, the resistivity of each metal oxide film has decreased through irradiation of ultraviolet rays (resistance reducing treatment). As shown in FIG. 3, however, for the undoped metal oxide film and the metal oxide film having a B/Zn molar concentration ratio of 0.2%, the resistivities of the metal oxide films have increased up to the level prior to the irradiation of ultraviolet rays (resistance reducing treatment) after a lapse of time from the end of the irradiation of ultraviolet rays (resistance reducing treatment).

Meanwhile, for the metal oxide films respectively having the B/Zn molar concentration ratios of 0.4%, 0.8%, and 1.8%, an increase in the resistance of the metal oxide film has been suppressed and a low-resistivity condition has been kept even after a lapse of time from the end of the irradiation of ultraviolet rays (resistance reducing treatment) (the resistances of the metal oxide films containing boron as a dopant have increased very little even after a lapse of time, and resistance values at the end of the resistance reducing treatment have remained nearly unchanged).

In a case where the metal oxide film contains boron as a dopant and a B/Zn molar concentration ratio when zinc and boron are supplied to the substrate 1 is not less than 0.4%, an increase in the resistance of the metal oxide film can be suppressed even after a lapse of time from the resistance reducing treatment performed on the metal oxide film.

FIG. 5 shows another experimental data on an effect of suppressing a resistance increase. FIG. 5 shows variations over time of the resistivity of each metal oxide film. To be more specific, FIG. 5 shows variations over time of the resistivity of each metal oxide film during irradiation of ultraviolet rays (resistance reducing treatment) and after the irradiation of ultraviolet rays. The vertical axis and horizontal axis of FIG. 5 indicate resistivity ($\Omega\cdot cm$) and time (h), respectively.

For the experimental data shown in FIG. 5, the measurement targets are an undoped metal oxide film containing zinc and a plurality of metal oxide films containing a dopant and zinc. Herein, a dopant is indium (In). FIG. 5 shows, as a plurality of metal oxide films containing a dopant and zinc, a metal oxide film having an In/Zn molar concentration ratio of 0.4% when zinc and indium were supplied to the substrate 1, a metal oxide film having an In/Zn molar concentration ratio of 0.8% when zinc and indium were supplied to the substrate 1, and a metal oxide film having an In/Zn molar concentration ratio of 2.0% when zinc and indium were supplied to the substrate 1.

Herein, the temperature for depositing all the metal oxide films is 200° C. Each metal oxide film is deposited in the deposition apparatus shown in FIG. 1, and the deposition conditions are as shown in FIG. 6.

Figures 6, 7:
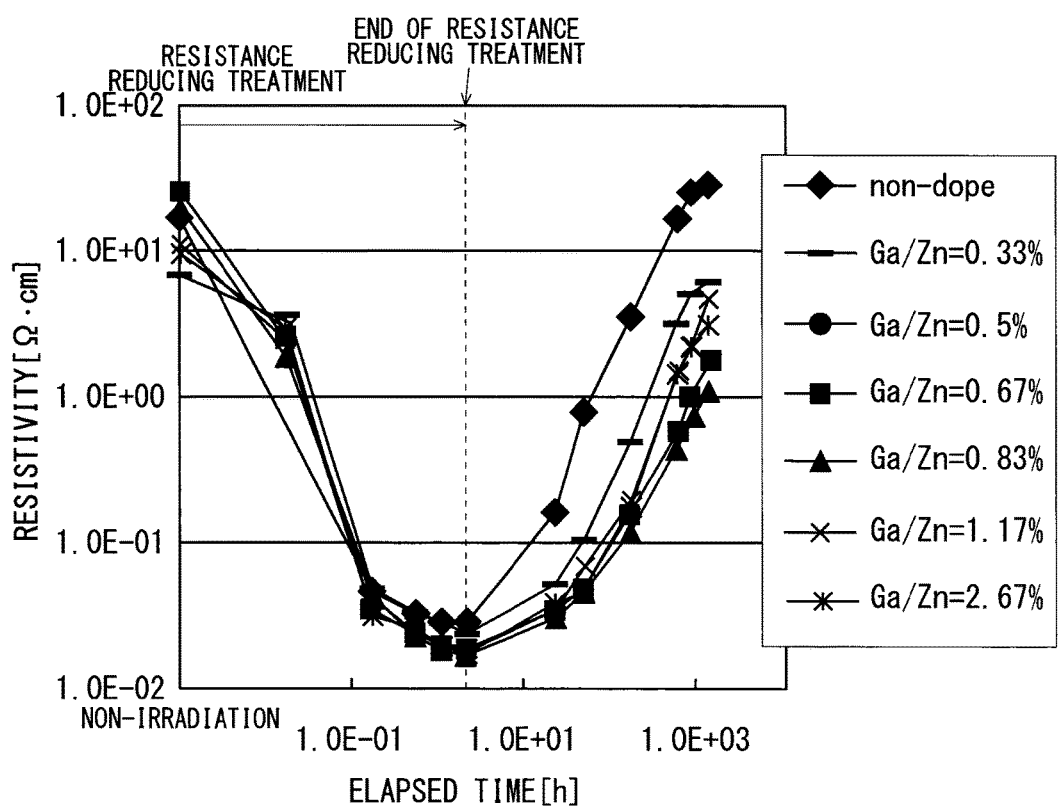
FIG. 6 A diagram showing deposition conditions of the metal oxide films.
FIG. 7 A diagram showing variations over time of the resistivities of metal oxide films deposited by the method for producing a metal oxide film according to the present invention.

As shown in FIG. 6, the amount of zinc supplied to the substrate 1 is 0.53 mmol/min for the metal oxide films respectively having In/Zn molar concentration ratios of 0.4%, 0.8%, and 2.0%, and the amount of an oxidizing agent (water) supplied to the substrate 1 is 67 mmol/min. The deposition conditions of the undoped metal oxide film shown in FIG. 6 are identical to the deposition conditions of the other undoped metal oxide film shown in FIG. 4.

As shown in FIG. 5, the resistivity of each metal oxide film has decreased through irradiation of ultraviolet rays (resistance reducing treatment). As shown in FIG. 5, however, for the metal oxide film being an undoped film, the resistivity of this metal oxide film has increased up to the level prior to the irradiation of ultraviolet rays (resistance reducing treatment) after a lapse of time from the end of the irradiation of ultraviolet rays (resistance reducing treatment).

Meanwhile, for the metal oxide films respectively having In/Zn molar concentration ratios of 0.4%, 0.8%, and 2.0%, an increase in the resistance of the metal oxide film has been suppressed and a low-resistivity condition has been kept even after a lapse of time from the end of the irradiation of ultraviolet rays (resistance reducing treatment) (the resistance of the metal oxide film containing indium as a dopant has increased a little compared with the metal oxide film containing boron as a dopant, but nevertheless, an increase in the resistance of the metal oxide film containing indium as a dopant has been suppressed sufficiently).

In a case where the metal oxide film contains indium as a dopant and an In/Zn molar concentration ratio when zinc and indium are supplied to the substrate 1 is not less than 0.4%, an increase in the resistance of the metal oxide film can be suppressed even after a lapse of time from the resistance reducing treatment performed on the metal oxide film.

FIG. 7 shows another experimental data on an effect of suppressing a resistance increase. FIG. 7 shows variations over time of the resistivity of each metal oxide film. To be more specific, FIG. 7 shows variations over time of the resistivity of each metal oxide film during irradiation of ultraviolet rays (resistance reducing treatment) and after the irradiation of ultraviolet rays. The vertical axis and horizontal axis of FIG. 7 indicate resistivity (Ω·cm) and time (h), respectively.

For the experimental data shown in FIG. 7, the measurement targets are an undoped metal oxide film containing zinc and a plurality of metal oxide films containing a dopant and zinc. Herein, the dopant is gallium (Ga). FIG. 7 shows, as a plurality of metal oxide films containing a dopant and zinc, a metal oxide film having a Ga/Zn molar concentration ratio of 0.33% when zinc and gallium were supplied to the substrate 1, a metal oxide film having a Ga/Zn molar concentration ratio of 0.5% when zinc and gallium were supplied to the substrate 1, a metal oxide film having a Ga/Zn molar concentration ratio of 0.67% when zinc and gallium were supplied to the substrate 1, a metal oxide film having a Ga/Zn molar concentration ratio of 0.83% when zinc and gallium were supplied to the substrate 1, a metal oxide film having a Ga/Zn molar concentration ratio of 1.17% when zinc and gallium were supplied to the substrate 1, and a metal oxide film having a Ga/Zn molar concentration ratio of 2.67% when zinc and gallium were supplied to the substrate 1.

Herein, the temperature for depositing all the metal oxide films is 200° C. Each metal oxide film is deposited in the deposition apparatus shown in FIG. 1, and the deposition conditions are as shown in FIG. 8.

As shown in FIG. 8, the amount of zinc supplied to the substrate 1 is 1.26 mmol/min for the metal oxide films respectively having Ga/Zn molar concentration ratios of 0.33%, 0.5%, 0.67%, 0.83%, and 1.17%, and the amount of an oxidizing agent (water) supplied to the substrate 1 is 67 mmol/min.

The amount of zinc supplied to the substrate 1 is 0.63 mmol/min for the metal oxide film having a Ga/Zn molar concentration ratio of 2.67%, and the amount of an oxidizing agent (water) supplied to the substrate 1 is 67 mmol/min.

The deposition conditions of the undoped metal oxide film shown in FIG. 8 are identical to the deposition conditions of the other undoped metal oxide film shown in FIG. 4.

As shown in FIG. 7, the resistivity of each metal oxide film has decreased through irradiation of ultraviolet rays (resistance reducing treatment). As shown in FIG. 7, however, for the metal oxide film being an undoped film, the resistivity of this metal oxide film has increased up to the level prior to the irradiation of ultraviolet rays (resistance reducing treatment) after a lapse of time from the end of the irradiation of ultraviolet rays (resistance reducing treatment).

Meanwhile, for the metal oxide films respectively having Ga/Zn molar concentration ratios of 0.33%, 0.5%, 0.67%, 0.83%, 1.17%, and 2.67%, an increase in the resistance of the metal oxide film has been suppressed even after a lapse of time from the end of the irradiation of ultraviolet rays (resistance reducing treatment) (the resistance of the metal oxide film containing Ga as a dopant has increased compared with the metal oxide films containing B and In as dopants, but nevertheless, an increase in the resistance of the metal oxide film containing Ga as a dopant has been suppressed).

In a case where the metal oxide film contains gallium as a dopant and a Ga/Zn molar concentration ratio when zinc and gallium are supplied to the substrate 1 is not less than 0.33%, an increase in the resistance of the metal oxide film can be suppressed even after a lapse of time from the resistance reducing treatment performed on the metal oxide film.

Aluminum (Al) is included in the same Group 13 elements as boron, indium, and gallium, and aluminum also has the same electronic structure as those of boron, indium, and gallium. Thus, also when a metal oxide film that contains aluminum as a dopant and contains zinc is deposited, the deposited metal oxide film behaves similarly to metal oxide films that contain zinc and, as a dopant, B, In, and Ga.

As can be seen from the consideration of FIGS. 3, 5, and 7, if a (B or In or Ga)/Zn molar concentration ratio when zinc and a dopant (B, In, Ga) are supplied to the substrate 1 is at least 0.4% or more, an increase in the resistance of the metal oxide film deposited through the above-mentioned supply can be suppressed after the resistance reducing treatment. Thus, also in a case where Al belonging to the same Group 13 as B, In, and Ga is adopted as a dopant and a metal oxide film containing zinc is deposited, if an Al/Zn molar concentration ratio when zinc and Al are supplied to the substrate 1 is at least 0.4% or more, an increase in the resistance of a metal oxide film to be deposited through the supply can be suppressed after the resistance reducing treatment.

The method for producing a metal oxide film according to this embodiment performs the process of depositing a metal oxide film on the substrate 1 under non-vacuum. This reduces a cost for the deposition process (deposition apparatus cost) and also improves convenience.

The method for producing a metal oxide film according to this embodiment also performs the resistance reducing treatment on a metal oxide film immediately after deposition. Therefore, if a metal oxide film is deposited on the substrate 1 under non-vacuum, the resistance of the metal oxide film can be reduced (the resistance of the metal oxide film deposited under non-vacuum can be reduced to be substantially equal to the resistance of a metal oxide film deposited under vacuum).

The method for producing a metal oxide film according to this embodiment further supplies (sprays) zinc and a dopant onto the substrate 1, to thereby deposit a metal oxide film on the substrate 1. Herein, the (dopant)/Zn molar concentration ratio is set to be not less than a predetermined value when zinc and a dopant are supplied to the substrate 1. For example, the (B or In or Al)/Zn molar concentration ratio is at least 0.4% or more, and the Ga/Zn molar concentration ratio is at least 0.33% or more.

Thus, the method for producing a metal oxide film according to the present invention can suppress an increase in the resistance of the metal oxide film subjected to the resistance reducing treatment even after a lapse of a long period of time from the end of the resistance reducing treatment.

The method for producing a metal oxide film according to this embodiment adopts the Group 13 element (boron, aluminum, gallium, indium) as a dopant of the metal oxide film in the deposition of a metal oxide film containing zinc. This allows a larger amount of current to flow through the metal oxide film to be deposited.

As can be seen from the comparison of FIGS. 3, 5, and 7, in the case where boron is adopted as a dopant, an increase in the resistance of a metal oxide film after the resistance reducing treatment can be suppressed most (the resistance value of a metal oxide film immediately after the resistance reducing treatment can be maintained even after a lapse of a long period of time). Boron (boric acid), which is stable and inexpensive, can further reduce a cost for depositing a metal oxide film and further improve the convenience of the method for producing a metal oxide film.

The deposition apparatus illustrated in FIG. 1 includes the container 3A for the solution 7, the container 3B for the oxidation source 6, and the container 3C for the dopant solution 5 that are independently provided. Alternatively, any of the containers 3A, 3B, and 3C can be omitted.

For example, the following configurations are adoptable: the solution 7 and the oxidation source 6 are put in the same one of the containers and the dopant solution 5 is put in the other container; the dopant solution 5 and the oxidation source 6 are put in the same one of the containers and the solution 7 is put in the other container; and the solution 7 and the dopant solution 5 are put in the same one of the containers and the oxidation source 6 is put in the other container.

Whether a container is provided for each of the solutions 5, 6, and 7 or a container is used in common for two solutions can be selected depending on the types of the dopant solution 7, the oxidation source 6, and the solution 5 (as an example, depending on the dopant solubility and the reactivity of each of the solutions 5, 6, and 7).

For example, boric acid is soluble in water, and thus, boric acid being the dopant solution 5 and water being the oxidation source 6 can be put in the same container.

As described above, the present invention needs to adjust a (dopant/Zn) molar concentration ratio to be not less than a predetermined value in a case where zinc and a dopant are supplied to the substrate 1. Herein, a molar concentration of an element to be supplied to the substrate 1 is most easily adjusted with the configuration in which the containers 3A, 3B, and 3C are individually provided for the solutions 5, 6, and 7 and the solutions 5, 6, and 7 are supplied to the substrate 1 through the different systems L1, L2, and L3, respectively.

The deposition process is performed under non-vacuum (at atmospheric pressure) in the present invention, allowing for the use of atmospheric oxygen as an oxidation source. Adoption of the configuration in which the oxidation source 6 is actively supplied to the substrate 1, as illustrated in FIG. 1, increases the deposition rate of a metal oxide film and also allows for deposition of a metal oxide film having good film quality.

The present invention has been described in detail, but the above-mentioned description is illustrative in all aspects and the present invention is not intended to be limited thereto. Various modifications not exemplified are construed to be made without departing from the scope of the present invention.

DESCRIPTION OF REFERENCE SIGNS

1 substrate
2 heating unit
3A, 3B, 3C container
4A, 4B, 4C atomizer
5 dopant solution
6 oxidation source
7 solution
8 nozzle
10 metal oxide film (transparent conductive film, zinc oxide film)
12 ultraviolet lamp
13 ultraviolet rays
L1, L2, L3 path

The invention claimed is:

1. A method for producing metal oxide film, the method comprising:
   (A) spraying a solution comprising zinc onto a substrate placed under non-vacuum;
   (B) spraying a dopant solution comprising a dopant onto the substrate, wherein the dopant is at least one of boron, gallium, indium and aluminum; and
   (C) performing, on a metal oxide film deposited on the substrate obtained after said spraying (A) and said spraying (B), a resistance reducing treatment by irradiating the metal oxide film with ultraviolet rays that does not involve rearrangement of crystals of the metal oxide film,
   wherein a molar concentration of the dopant supplied to the substrate in said spraying (B) with respect to a molar concentration of zinc supplied to the substrate in said spraying is not less than 0.4% when the dopant is at least one of boron, indium and aluminum and is not less than 0.33% when the dopant is gallium.

2. The method according to claim 1, further comprising
   (D) spraying an oxidation source onto the substrate in said spraying (A) and said spraying (B).

3. The method according to claim 2, wherein the solution in said spraying (A), the oxidation source in said spraying (D), and the dopant solution in said spraying (B) are supplied to the substrate through different systems.

4. The method according to claim 1, wherein the dopant is boron.

5. The method according to claim 1, wherein the dopant is gallium.

6. The method according to claim 1, wherein the dopant is indium.

7. The method according to claim 1, wherein the dopant is aluminum.

* * * * *